(12) United States Patent
Yu

(10) Patent No.: US 8,536,953 B1
(45) Date of Patent: Sep. 17, 2013

(54) QUARTZ OSCILLATOR MODULE

(75) Inventor: Meng-Che Yu, New Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 0 days.

(21) Appl. No.: 13/477,085

(22) Filed: May 22, 2012

(30) Foreign Application Priority Data

Apr. 9, 2012 (TW) .............................. 101112436 A

(51) Int. Cl.
*H03B 5/32* (2006.01)
(52) U.S. Cl.
USPC ...... 331/158; 331/2; 331/116 R; 331/116 FE; 331/46

(58) Field of Classification Search
USPC ........................ 331/158, 2, 46, 116 R, 116 FE
See application file for complete search history.

(56) References Cited

U.S. PATENT DOCUMENTS 7,075,381 B2 * 7/2006 Hashimoto ................... 331/158
7,629,855 B2 * 12/2009 Matsumoto ...................... 331/49

* cited by examiner

*Primary Examiner* — Arnold Kinkead
(74) *Attorney, Agent, or Firm* — Altis Law Group, Inc.

(57) ABSTRACT

A quartz oscillator module includes a first quartz oscillator, a second quartz oscillator, a first electronic switch, and a second electronic switch. The first and second quartz oscillators provide two different clock signals. When the first electronic switch is turned on, the first quartz oscillator is activated. When the second electronic switch is turned on, the second quartz oscillator is activated.

4 Claims, 2 Drawing Sheets

QUARTZ OSCILLATOR MODULE

BACKGROUND

1. Technical Field

The present disclosure relates to a quartz oscillator module.

2. Description of Related Art

A crystal oscillator is an electronic oscillator circuit that uses the mechanical resonance of a vibrating crystal of piezo-electric material to create an electrical signal with a very precise frequency. However, most crystal oscillators just provide signals with one frequency. This is inconvenient.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
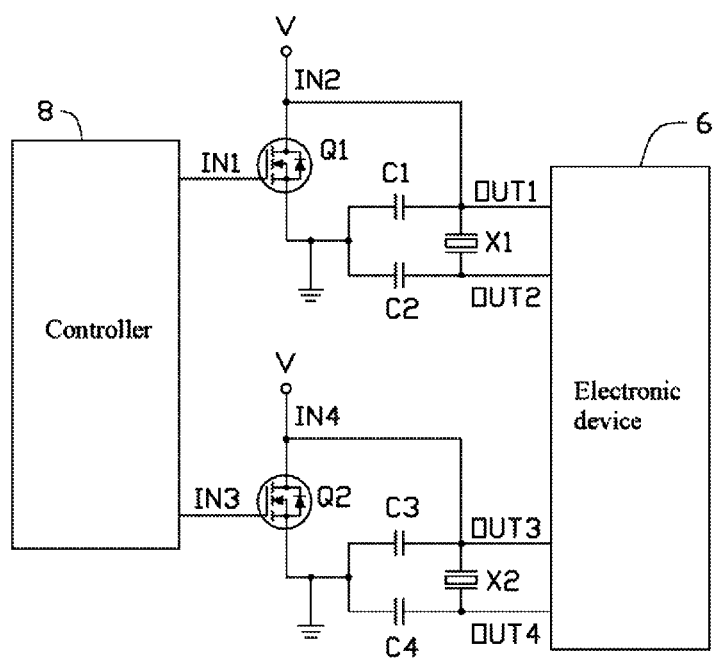
FIG. 1 is a circuit diagram of an exemplary embodiment of a quartz oscillator module.

FIG. 1, is an exemplary embodiment of a quartz oscillator module including a first n-channel metal-oxide semiconductor field-effect transistor (NMOSFET) Q1, a second NMOSFET Q2, a first quartz oscillator X1, a second quartz oscillator X2, and four capacitors C1, C2, C3, and C4. The first quartz oscillator X1 provides a first clock signal of a first frequency. The second quartz oscillator X2 provides a second clock signal of a second frequency. In the embodiment, the first frequency is different from the second frequency.

A gate of the first NMOSFET Q1 receives a first control signal. A drain of the first NMOSFET Q1 is connected to a power supply Vdd and a first terminal of the first quartz oscillator X1. A source of the first NMOSFET Q1 is connected to the first terminal and a second terminal of the first quartz oscillator X1 respectively through the capacitors C1 and C2. The source of the first NMOSFET Q1 is further grounded. In this embodiment, the gate of the first NMOSFET Q1 is regarded as a first input IN1 of the quartz oscillator module, the drain of the first NMOSFET Q1 is regarded as a second input IN2 of the quartz oscillator module, the first and second terminals of the first quartz oscillator X1 are respectively regarded as a first output OUT1 and a second output OUT2 of the quartz oscillator module. The first and second outputs OUT1 and OUT2 are connected to an electronic device 6 for providing the first clock signal to the electronic device 6.

A gate of the second NMOSFET Q2 receives a second control signal. A drain of the second NMOSFET Q2 is connected to the power supply Vdd and a first terminal of the second quartz oscillator X2. A source of the second NMOSFET Q2 is connected to the first terminal and a second terminal of the second quartz oscillator X2 respectively through the capacitors C3 and C4. The source of the second NMOSFET Q2 is further grounded. In this embodiment, the gate of the second NMOSFET Q2 is regarded as a third input IN3 of the quartz oscillator module, the drain of the second NMOSFET Q2 is regarded as a fourth input IN4 of the quartz oscillator module, the first and second terminals of the second quartz oscillator X2 are respectively regarded as a third output OUT3 and a fourth output OUT4 of the quartz oscillator module. The third and fourth outputs OUT3 and OUT4 are connected to the electronic device 6 for providing the second clock signal to the electronic device 6.

Figure 2:
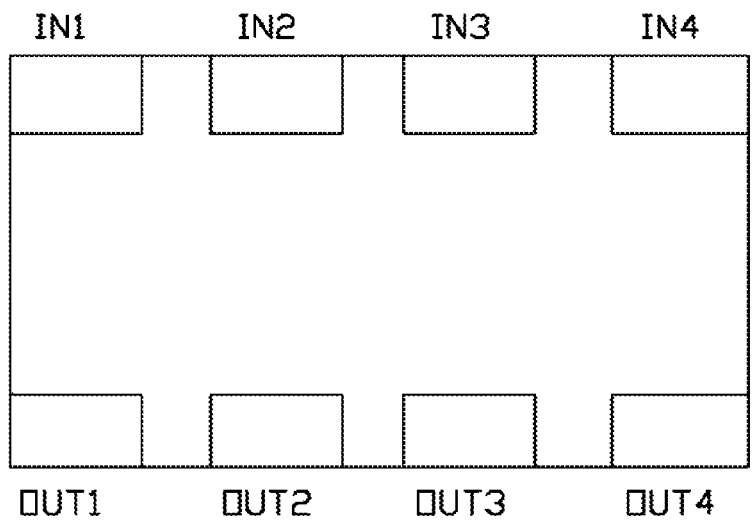
FIG. 2 is a schematic diagram of the quartz oscillator module of FIG. 1.

FIG. 2 shows a schematic diagram of the quartz oscillator module. The quartz oscillator module includes the first to fourth inputs N1, IN2, IN3, and IN4, and first to fourth outputs OUT1, OUT2, OUT3, and OUT4. In use, the first and third inputs IN1 and IN3 of the quartz oscillator module are connected to a controller 8 for receiving the first and second control signals. The second and fourth inputs IN2 and IN4 of the quartz oscillator module are connected to the power supply Vdd. The first to fourth outputs OUT1, OUT2, OUT3, and OUT4 of the quartz oscillator module are connected to the electronic device 6 for providing the first clock signal or the second clock signal to the electronic device 6.

When the electronic device 6 needs to receive the first clock signal, the first control signal is at a low level, and the second control signal is at a high level. The first NMOSFET Q1 is turned off, and the second NMOSFET Q2 is turned on. As a result, the power supply Vdd is transmitted to the first quartz oscillator X1. The first quartz oscillator X1 is activated, and the second quartz oscillator X2 is not activated. In this situation, the electronic device 6 receives the first clock signal. When the electronic device 6 needs to receive the second clock signal, the first control signal is at a high level, and the second control signal is at a low level. The second NMOSFET Q2 is turned off, and the first NMOSFET Q1 is turned on. As a result, the power supply Vdd is transmitted to the second quartz oscillator X2. The second quartz oscillator X2 is activated, and the first quartz oscillator X1 is not activated. In this situation, the electronic device 6 receives the second clock signal.

In the embodiment, the first and second NMOSFETs Q1 and Q2 function as electronic switches. Therefore, the first and second NMOSFETs Q1 and Q2 can be replaced by any other electronic switches. Furthermore, in other embodiment, the quartz oscillator module may include more than two quartz oscillators. Correspondingly, the quartz oscillator module includes more than two NMOSFETs, and the controller 8 outputs more than two control signals.

The foregoing description of the exemplary embodiments of the disclosure has been presented only for the purposes of illustration and description and is not intended to be exhaustive or to limit the disclosure to the precise forms disclosed. Many modifications and variations are possible in light of everything above. The embodiments were chosen and described in order to explain the principles of the disclosure and their practical application so as to enable others of ordinary skill in the art to utilize the disclosure and various embodiments and with various modifications as are suited to the particular use contemplated. Alternative embodiments will become apparent to those of ordinary skills in the art to which the present disclosure pertains without departing from its spirit and scope. Accordingly, the scope of the present disclosure is defined by the appended claims rather than the foregoing description and the exemplary embodiments described therein.

What is claimed is:

1. A quartz oscillator module comprising:
a first quartz oscillator comprising two terminals connected to an electronic device, wherein the first quartz oscillator provides a first clock signal to the electronic device;
a second quartz oscillator comprising two terminals connected to the electronic device, wherein the second quartz oscillator provides a second clock signal to the electronic device;
a first electronic switch comprising a control terminal receiving a first control signal, a first terminal connected to a power supply, and a second terminal connected to the two terminals of the first quartz oscillator respectively through a first capacitor and a second capacitor, wherein the second terminal of the first electronic switch is further grounded, the first control signal makes the first terminal connect or disconnect with the second terminal, when the first terminal is connected to the second terminal, the first quartz oscillator is not activated, when the first terminal is disconnected from the second terminal, the first quartz oscillator is activated; and
a second electronic switch comprising a control terminal receiving a second control signal, a first terminal connected to the power supply, and a second terminal connected to the two terminals of the second quartz oscillator respectively through a third capacitor and a fourth capacitor, wherein the second terminal of the second electronic switch is further grounded, the second control signal makes the first terminal connect or disconnect with the second terminal, when the first terminal is connected to the second terminal, the second quartz oscillator is not activated, when the first terminal is disconnected from the second terminal, the second quartz oscillator is activated.

2. The quartz oscillator module of claim 1, wherein the first electronic switch is a n-channel metallic oxide semiconductor field effect transistor (NMOSFET), a gate of the NMOSFET is the control terminal of the first electronic switch, a drain of the NMOSFET is the first terminal of the first electronic switch, a source of the NMOSFET is the second terminal of the first electronic switch.

3. The quartz oscillator module of claim 1, wherein the second electronic switch is a n-channel MOSFET, a gate of the NMOSFET is the control terminal of the second electronic switch, a drain of the NMOSFET is the first terminal of the second electronic switch, a source of the NMOSFET is the second terminal of the second electronic switch.

4. The quartz oscillator module of claim 1, wherein the frequency of the first clock signal is different from the second clock signal.

* * * * *